United States Patent [19] [11] 3,971,038
Myer [45] July 20, 1976

[54] COERCIVITY CONTROL AND DETECTION SIGNAL GENERATING PATTERN FOR UNIAXIALLY ANISOTROPIC FERROMAGNETIC CRYSTAL PLATELETS

[75] Inventor: Jon H. Myer, Woodland Hills, Calif.
[73] Assignee: Hughes Aircraft Company, Culver City, Calif.
[22] Filed: July 29, 1974
[21] Appl. No.: 492,390

[52] U.S. Cl. .................. 340/174 TF; 340/174 EB; 340/174 HA; 340/174 YC
[51] Int. Cl.² ........................................ G11C 11/14
[58] Field of Search ................ 340/174 TF, 174 SR

[56] References Cited
UNITED STATES PATENTS

| | | | |
|---|---|---|---|
| 3,564,518 | 2/1971 | Fischer | 340/174 TF |
| 3,701,129 | 10/1972 | Copeland | 340/174 TF |
| 3,824,573 | 7/1974 | Scarzello et al. | 340/174 TF |
| 3,842,407 | 10/1974 | Argyle et al. | 340/174 TF |
| 3,863,234 | 1/1975 | Semon et al. | 340/174 TF |

OTHER PUBLICATIONS
IEEE Transactions On Magnetics, "Application of Orthoferrites to Domain Wall Devices" by Bobeck et al., vol. mag. 5, No. 3, Sept., 1969; 340–174TF; pp. 544–553.

*Primary Examiner*—James W. Moffitt
*Attorney, Agent, or Firm*—Donald C. Keaveney; W. H. MacAllister

[57] ABSTRACT

There is disclosed coercivity control and signal generating and detection means comprising a two-dimensional lattice array of dots of magnetically susceptible material in intimate physical contact with the major plane surface of a uniaxially anisotropic ferromagnetic crystal platelet which has its major plane surface cut perpendicularly to the easy axis of magnetization of the crystal so as to be capable of sustaining movable cylindrical magnetic domains therein. Such crystals are used in digital signal translating and memory devices. In the conductor access type of device disclosed herein such domains are moved between predetermined locations in the crystal by electrical drive signals in magnetic field generating conductor loops. By providing the lattice array of dots, each of which is of a size having a maximum dimension which is a small fraction of the minimum diameter of the smallest bubble sustainable in the crystal, it is possible to control the coercivity of the crystal platelet and thereby achieve a greater stability of bubble positioning by the access conductors, a faster switching rate and a greater temperature independence for the necessary biasing field. The lattice array used for coercivity control is also such as to give rise to a signal generated by the bubble being moved with respect to the lattice array which signal may be used to detect the motion of the bubble.

8 Claims, 7 Drawing Figures

COERCIVITY CONTROL AND DETECTION SIGNAL GENERATING PATTERN FOR UNIAXIALLY ANISOTROPIC FERROMAGNETIC CRYSTAL PLATELETS

BACKGROUND OF THE INVENTION

There has been described in my U.S. Pat. No. 3,806,903 and in the art cited therein a class of digital signal translating and/or memory devices which utilize movable cylindrical magnetic domains sustainable in uniaxially anisotropic ferromagnetic crystal platelets. Some of the properties of such cylindrical magnetic domains were also described in an article which appeared at page 78 of the June, 1971 issue of "Scientific American," which article was entitled, "Magnetic Bubbles," by Andrew H. Bobeck and H. E. D. Scoville.

From the above sources it will be noted that two of the most commonly used types of crystals for these devices are the orthoferrites and the garnets. The invention herein described is particularly suitable for but not restricted to the orthoferrites. From the above sources it will also be noted that, as stated on page 85 of the Bobeck article, there are two general methods for controlling the motion of such bubbles. The first employs conductors in which flowing currents generate the driving fields. This method is called conductor access. The second, which is called field access, involves immersing the entire wafer in either a pulsating or rotating magnetic field that acts on the bubble by means of carefully placed patterns of magnetic material that concentrate the field. The present invention is directed to devices utilizing conductor access techniques with orthoferrite crystals.

Where the field access technique is used, it is desirable to have a crystal which inherently has as high a mobility or as low a coercivity as is possible in order that the driving field in which the device is immersed may be as efficient as possible. The carefully placed patterns of magnetic material that concentrate the field in such devices are used to define the paths of travel or the locations of bubbles in the crystal in a manner well illustrated by the photographs on page 86 of the Bobeck article. As may be seen therein, the T-bar patterns are considerably larger than the diameter of a bubble and even the "angel fish" patterns are composed of dots, each of which are nearly as large as a bubble. In this type of field access device these "Permalloy" patterns perform the function of determining bubble location which function is performed by the magnetic fields of the electrical conductors in a conductor access device. The inherent increase of coercivity resulting from these patterns is an undesired detriment in these rotating field access devices and the pattern does not extend over any significant portion of the device, but is confined to the minimum area necessary to determine guideways or bubble locations.

As is pointed out on page 88 of the Bobeck article, the bubbles which are moved through these positions determined as described above may conventionally be detected by electromagnetic induction, the Hall effect, direct optical sensing, or magneto-resistance techniques. None of these techniques utilizes the unmodified guiding "Permalloy" patterns to also facilitate bubble detection.

The class of device to which the present invention is directed is a conductor access type as described in my issued U.S. Pat. No. 3,806,903. These conductor access devices use ferromagnetic crystal platelets formed of one of the orthoferrites. Such crystals have sufficient intrinsic coercivity themselves to make the conductor access techniques feasible. However, if one attempts to increase the efficiency of such devices by smoothing out the intrinsic coercivity in the crystal with heat treatment or the like, it is found that a considerable lack of homogeneity still remains and that it is not possible to smooth out small irregularities in bulk and surface properties of the crystal.

It is a purpose of the present invention to provide a means for uniformly controlling the localized coercivity over an extended area of the crystal platelet which means simultaneously affords an improved method of detecting the movement of the magnetic domains.

SUMMARY OF THE INVENTION

The present invention provides localized control of coercivity in a predetermined area of a crystal platelet of a material such as an orthoferrite by depositing on it or otherwise placing in intimate physical contact with it a two-dimensional lattice of dots of magnetically susceptible material such as an orthogonal array of "Permalloy" dots. The dots may be "Permalloy" or any other material having a higher permeability than that of the material of the crystal platelet. The array extends over that portion of the plane of the major surface of the crystal platelet which will be positioned adjacent to access conductor array patterns to determine a plurality of domain retaining locations in the crystal. In one preferred example, each of the dots had a uniform shape and uniform spacing and extended in a two-dimensional orthogonal array. In this example there were between six and nine dots in a length equal to the diameter of a typical cylindrical domain maintained in the material. The spacing between dots was slightly greater than the diameter of the round dots.

Such an array has the effect of increasing the stability of the bubbles over a wider range of externally applied magnetic biasing fields thereby making the device also less sensitive to ambient temperature. It also permits a larger drive current to be applied to the access conductors so as to move the bubbles more rapidly without danger of collapsing, exploding or splitting the bubble. The essential relationships between the dot size and the bubble size necessary to achieve these results will be discussed in detail below.

BRIEF DESCRIPTION OF THE DRAWINGS

These and other advantages and features of the invention will be better understood from the detailed description below taken in conjunction with the drawings attached hereto in which like reference characters refer to like parts throughout and wherein.

DETAILED DESCRIPTION OF THE INVENTION

Figure 1:
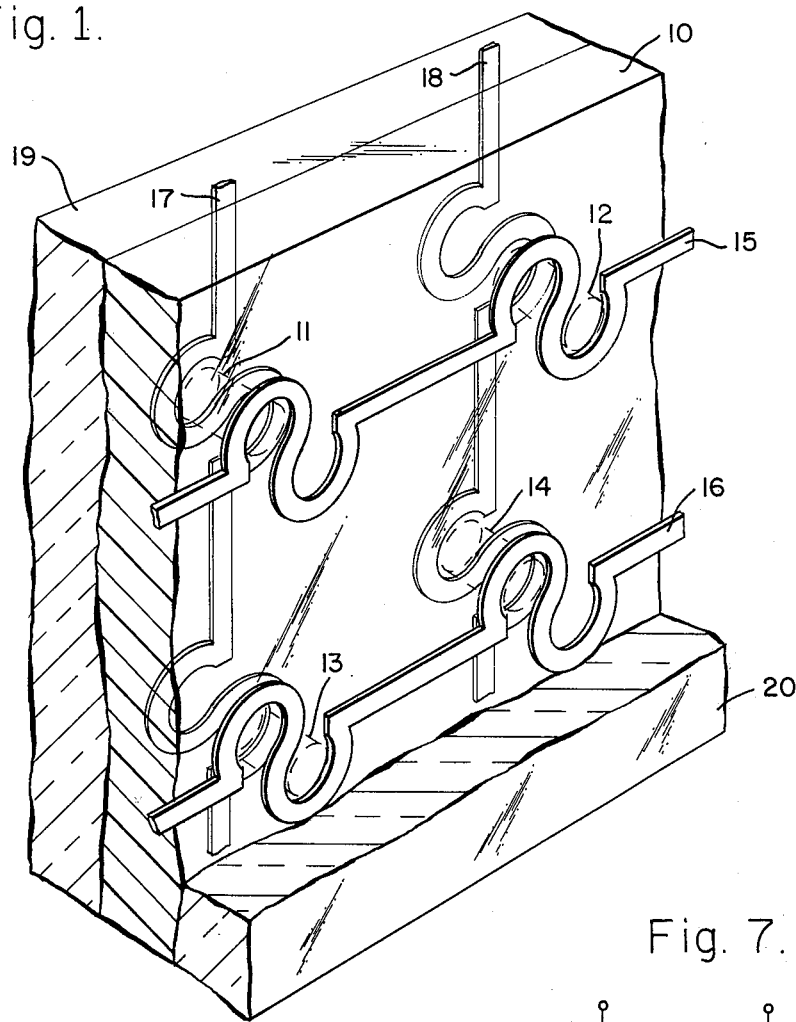
FIG. 1 is a broken away perspective view of a portion of a crystal platelet sandwich of the prior art type to which the present invention is applicable.

There is shown in FIG. 1 a broken away perspective view of a portion of the crystal platelet and conductor array sandwich of the type described in my U.S. Pat. No. 3,806,903 which portion is large enough to accommodate a representation of 4 bits. Typically, the yttrium orthoferrite crystal platelet 10 has magnetic bubbles 11, 12, 13 and 14 formed therein and sustained by any suitable means for applying an external magnetic bias field. The bubbles are, of course, movable cylindrical magnetic domains. The uniaxial anisotropic ferromagnetic crystal platelet 10 is cut to have its major plane surfaces perpendicular to the easy axis of magnetization of the crystal and is provided not only with magnetic biasing means, but also with conductor access means to control the positions of the movable domains in the platelet 10. The conductor access means comprises magnetic field generating conductors such as conductors 15 and 16, extending in the X direction and conductors 17 and 18, extending in the Y direction. These conductor patterns are preferably deposited or otherwise formed on insulating substrates such as the glass plates 19 and 20. Thus, the conductors extending in the Y direction are supported by glass plate 19, while the conductors extending in the X direction are supported by glass plate 20 shown only in a fragment for clarity of illustration. In fact, there are of course, many more conductors parallel to each other extending in each direction and the crystal platelet is sandwiched between the glass plates 19 and 20, which are coextensive with it and positioned adjacent to it. An appropriate half current applied to one X conductor and one Y conductor will cause the bubble or cylindrical domain retained at the intersection of these two conductors to be moved from one subportion of the double loop illustrated to the other subportion. One of these subportions is arbitrarily assigned a value of binary 0 and the other, a value of binary 1. Any conventional means, such as described in my patent or in the literature may be used to detect the location of the bubble.

The bubbles or cylindrical domains 11, 12, 13 and 14 in FIG. 1 are fixed or held at the conductor intersection locations during inactive or non-reading intervals, either by providing a crystal with sufficient intrinsic coercivity as is assumed in FIG. 1, or by providing conductor-controlled "Permalloy" latching bars as has been illustrated in the prior art. The use of conductor-controlled bars at the points of conductor intersection unnecessarily complicates the design and fabrication of the controlling conductor array. The alternate technique, in which intrinsic coercivity in the crystal is employed to localize the domains, has been found to be impractical in commercial practice since heat treatment cannot smooth out irregular bulk and surface defects in the crystal. As a result, the coercivity of the crystal platelet can vary widely over the area of the device and is very difficult to equalize in large scale production.

In FIGS. 2, 3, 4 and 5, there is shown an orderly array of coercive sites which act as latches and which extend over the predetermined portion of the plane of the major surface of the crystal platelet which is designed to include domain retaining locations. The array 30 is formed on or otherwise in intimte physical contact with the major plane surface of a crystal platelet 32, which is otherwise entirely like the crystal platelet 10 of FIG. 1. The array 30 consists of a plurality of dots, such as the dot 31, each of which may consist of a small bit of "Permalloy" or other material of high permeability by comparison to the permeability of the crystal. As is well known, "Permalloy" is a magnetic alloy having high permeability and usually consisting of iron, nickel and small quantities of other metals.

Figure 2:
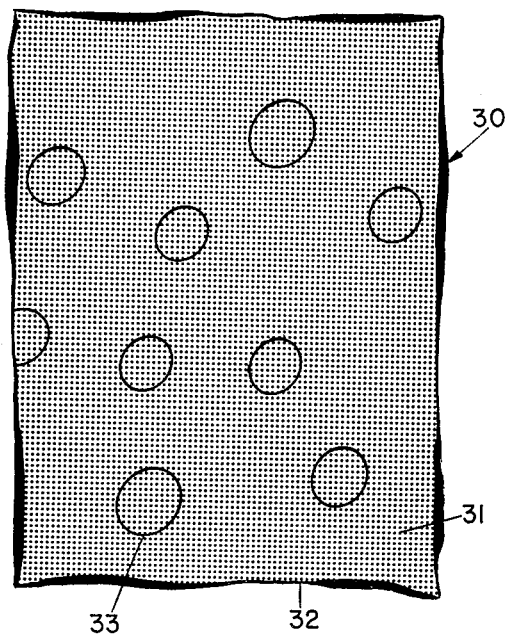
FIGS. 2, 3 and 4 are reproductions of microphotographs of the major plane surface of a crystal platelet of the type shown in FIG. 1, but having the coercivity control dots of the present invention applied thereto, and with gradually increasing bias field as between FIGS. 2, 3, and 4.

FIG. 2 is a micro photograph of a crystal platelet supporting a cylindrical domain 33 and other similar cylindrical domains on which the array 30 has been deposited. It will be observed that the maximum dimension in the plane of the crystal of the dot 31 is a minor fraction of the minimum diameter of the cylindrical domain which can be sustained in the given crystal platelet. Preferably, the maximum dimension of the dot 31 is less than one fifth of the diameter of the cylindrical domain 53 or other similar domains when at their minimum sustainable size. Although the array shown is an orthogonal array of dots extending in both the X and Y direction and equally spaced along those two axes, it will be understood that any lattice comprising an orderly pattern or array of dots otherwise meeting the criteria set forth below may be used. For example, a dot array with different spacing along one axis of the plane when compared to the other will provide an anisotropic coercivity effect in the plane of the crystal and provide higher mobility in one direction when compared to any other.

Figure 3:
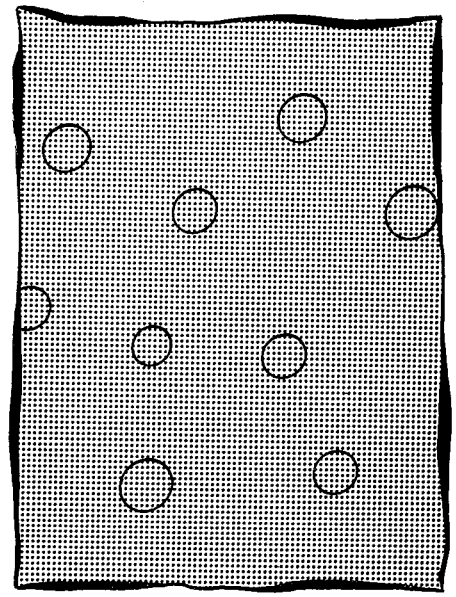
Figure 4:
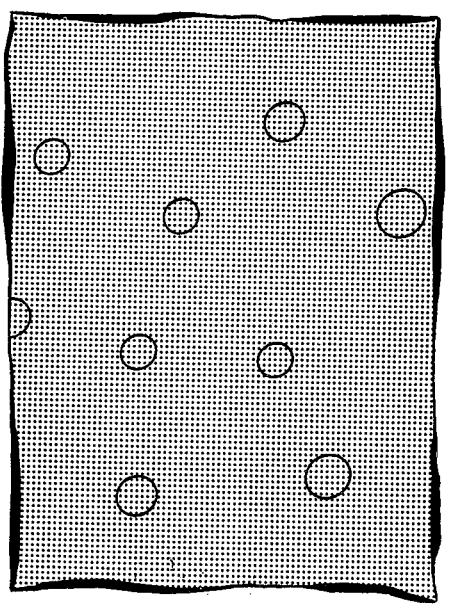
Figure 5:
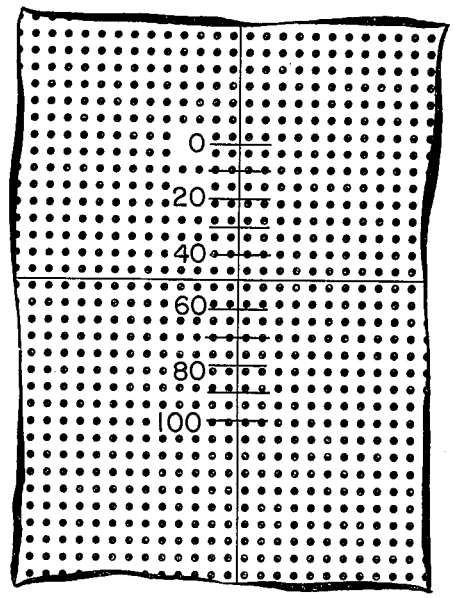
FIG. 5 is a microphotograph similar to those of FIGS. 2, 3 and 4, but showing the coercivity control dots at a higher magnification.

FIGS. 2, 3, and 4 are reproduced from photographs taken through a microscope showing crystal platelets having the local coercivity control array applied thereto. The photographs reproduced in FIGS. the 3 and 4 were taken with gradually increasing bias field causing the bubbles to shrink progressively in the respective views. However, this shrinkage did not occur and does not occur continuously or monotonically as it does in the absence of the coercivity control array, but rather occurs in discrete jumps as illustrated in the drawings. There is no stable bubble size in between these three illustrated sizes and an additional minute increment of bias field from that used produce the distribution shown in FIG. 4 will cause all bubbles to disappear. Closer scrutiny of the bubble circumferences revealed that the bubbles always attach themselves to minimum energy lines established by the rows of the coercivity control dots and that the bubble size differences which occur in quantum jumps between the three pictures are substantially equal to the center-to-center dot spacing between rows of dots. The jumping from one size to the next is clearly noticeable when visually observed under the microscope and the change in bubble diameter is always substantially equal to some multiple of the spacing between the rows of dots. The little "Permalloy" dots thus apparently provide a stabilizing force. This conclusion is further supported by the observed fact that during switching of the cylindrical magnetic domains from one location to another at a given intersection, the bubble domains can tolerate much more intense accelerating field pulses without breaking up when the "Permalloy" dots are used on the platelet than they can in their absence. As a result of this phenomenon, it has been possible to repeatedly switch an yttrium orthoferrite bubble from the 0 to the 1 position in a memory loop of the type illustrated with a 70 nanosecond current pulse of between 800 microamperes and 1 ampere. The coercivity control array of dots thus gives as an additional benefit the possibility of higher switching rates than can be achieved in their absence.

An additional observed desirable effect of the use of the coercivity dot array is its effect upon the range of applied bias field values throughout which the bubble is stable and as a consequence, the range of achievable bubble diameters which can be sustained in a given platelet. An yttrium orthoferrite platelet was measured without the coercivity control dot array and the average of 20 measurements of the range of magnetic bias field throughout which stable cylindrical domains could be maintained was observed to be 9.21 oersteds with a standard deviation of 1.90 oersteds. The same platelet to which the illustrated array of coercivity dots identified was applied was then subjected to similar observation and measurement, and it was found that the range of magnetic bias fields throughout which stable bubbles could be sustained was 12.05 oersteds with a standard deviation based on 20 measurements of 3.24 oersteds. The advantage deriving from the fact that the use of the array by controlling the coercivity leads to more stable bubbles and higher switching rates is thus augmented by the fact that both smaller and larger cylindrical domains can be achieved in a given platelet and by the fact that even for a median size domain, the device will operate stably over a wider temperature range since the required bias field is temperature dependent as is known in the art.

The material of the crystal platelet in the example recited above was yttrium orthoferrite and the coercivity dots were formed of "Permalloy." The stable bubble dimensions with the use of the array of dots shown ranged from 87.5 micrometers, which in fact equalled the space occupied by seven rows of dots, to 162.5 micrometers which equal the space occupied by 13 rows of dots. The normal range of bubble size sustainable in the orthoferrite material (which was a crystal platelet 100 micrometers thick) ranges from 80 micrometers to 120 micrometers. The "Permalloy" dots illustrated in the pattern were on 12.5 micrometers center-to-center spacing and were 1,000 angstroms in thickness. The diameter of each dot was between 2 and 3 micrometers. The array of "Permalloy" dots was formed on the surface of the orthoferrite crystal platelet by first depositing thereon a commercially available photoresist masking layer in which the dot pattern was formed by conventional photolithographic techniques. The "Permalloy" material was then sputtered through the dot indicating holes so formed in the photoresist mask and thereafter the remainder of the photoresist material was lifted off in a manner well known in the art.

In order to achieve the results desired from the array of coercivity control dots, there should be a minimum of three dots along a diameter of the minimum bubble size which can be sustained in the given crystal and a maximum of nine dots along such a diameter. In the prior art the use of "Permalloy" patterns for guiding or latching magnetic bubbles has applied T-bars or the like, which for the most part are larger than a bubble diameter or which at the smallest have been larger than half a bubble diameter, in order for them to perform their intended functions. Such patterns will not and cannot give rise to the results desired herein. At the above suggested maximum size limit for a coercivity control dot of three dots per diameter of the mimimum size bubble and assuming that the dots are equally spaced, then the maximum dot size is on fifth of a bubble diameter. While the maximum size of the control dot is set by these functional considerations, the minimum usable size is limited only by the smallest size practically achievable with photolithographic techniques. Also, the smallest spacing between dots is in practice equal to a diameter of the dot being used, but larger or uneven spacings are unable, subject to the above limitations as to the number of dots per linear diameter of bubble size. If the dots are too large or too closely spaced together, the effect on the magnetic fields becomes simply that of the prior art latching bars and the desired coercivity control is not achieved. If the dots are too widely spaced apart, the desired fringing of the magnetic field lines between the individual dots of the array of dots in and through the void spaces is not achieved on a uniform basis. Finally, the thickness of the dot measured perpendicularly to the surface of the crystal should not be more than half the diameter of the dot. In the example given above, and illustrated in the drawings, the coercivity control dots have a thickness of 1,000 angstrom units and a diameter between 2 and 3 micrometers and were deposited on a crystal platelet of 100 micrometers thickness.

In addition to improving the switching rate and bubble stability as discussed above, the array of coercivity control dots also makes possible a means of detecting the presence of bubbles by their motion which has not heretofore been available. In the past, either the presence in a bit location or the motion of bubbles into or out of such a location has been detected by various means, such as optical detection by Faraday or magneto-optic Kerr effect, electrical detection by Hall or pseudo-Hall effect or magneto-resistive effect, or inductive detection by field change due to bubble expansion and collapse. Each of these techniques has a particular feature which makes it attractive to a particular design of magnetic domain field access serial shift register type memories. The detection and sensing means afforded by the use of the array of coercivity dots disclosed herein (which for convenience will hereafter be referred to as "stubble") detects the motion or passage of a cylindrical domain and is particularly adapted for use in conductor access random access memories.

A cylindrical domain which moves in a platelet in such a device, which platelet has an array of either ferromagnetic or ferrimagnetic dots on either or both of its surfaces will be periodically distorted by the attraction of the fringing fields of these dots. During the movement of the domain, it will therefore undergo a periodic expansion and contraction in size which can be electromagnetically sensed by an overlaying coil. Thus, as the domain moves over the stubble, it produces a pseudo-Barkhausen noise in the sensing coil which signals its passage. The known predetermined spacing between the stubble dots and the measurable velocity of the motion of the domain for a given driving current, are sufficient to determine approximately what the frequency of the resulting pseudo-Barkhausen noise will be. Knowing this predicted value, a precise measurement of the actual resulting noise can be made by any suitable signal frequency sensing technique. An amplifier approximately tuned to the Barkhausen frequency of the platelet device can then be used to select the desired signal. By placing the sensing coil, which detects the pseudo-Barkhausen signal, in such a manner that it will not inductively couple into the driving coil, the signal-to-noise ratio of the system can be kept very high.

One way to avoid this coupling is to place the sensing coil 40, which is tuned by capacitor 41 to the desired Barkhausen frequency, around the outside of the crystal platelet device. This arrangement is illustrated in FIG. 6, wherein it is contemplated that the terminals 42 and 43 will be connected to the sensing amplifier and that appropriate drive circuitry will be provided for the schematically illustrated conductor access loops.

Figure 7:
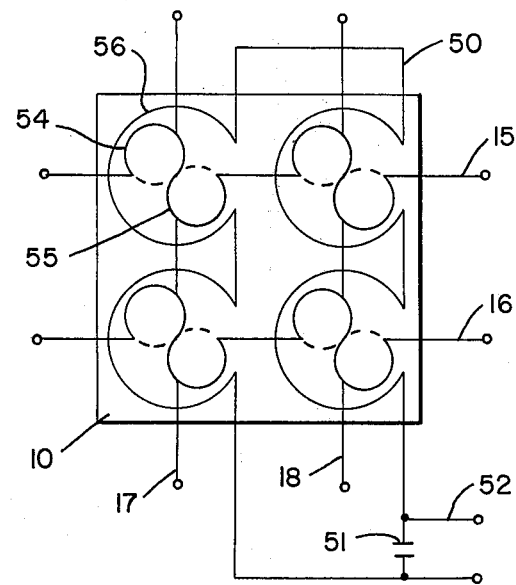
FIG. 7 is a schematic circuit diagram similar to that of FIG. 6 but indicating a second circuit by which motion of the bubble with respect to the array of dots may be detected.

In FIG. 7, and alternate coil arrangement is shown wherein the sensing circuit 50 is tuned by capacitor 51 and the output line 52 is connected between ground and the sensing amplifier. In this arrangement, coupling to the drive coils is avoided by placing the sensing loops of the conductor 50 symmetrically over the reentrant driving loops so that the two halves of the driving loop cancel each other inductively. For example, the two halves 54 and 55 of a driving conductor at one bit location are surrounded by a sensing loop 56 which is shaped and dimensioned in such manner that the inductively coupled signal from a current in loop 54 is just cancelled by the signal resulting from the same current as it flows through loop 55. Thus, the coil 56 will be affected only by the changes in magnetic field resulting from the changes in shape of the bubble as it moves between the two positions indicated between the loops of the drive coil and will not be affected by the field of the drive signal itself.

Figure 6:
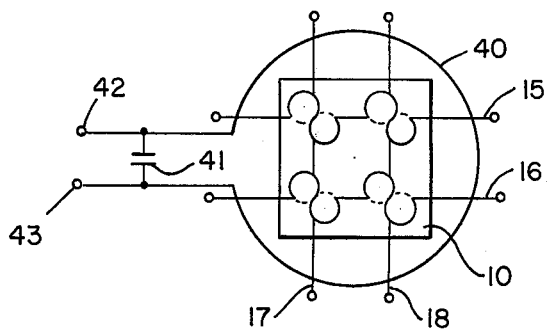
FIG. 6 is a schematic circuit diagram indicating one circuit by which motion of the magnetic bubbles with respect to the array of dots may be detected.

The arrangement shown in FIG. 6 has the advantage that there is less direct coupling to the drive current pulse but it has the disadvantage of loss of sensitivity. The arrangement shown in FIG. 7 has the advantage of higher sensitivity, but it requires exact juxtapositioning and very precise form and dimension control for both the drive circuit loops and the sensing coil loops to avoid coupling of the drive current pulses into the sensing circuit in inductive imbalance.

There has thus been described a means for attaining a uniform coercivity control in a crystal platelet which coercivity is sufficiently large to mask out coercivity variations in the platelet itself and which at the same time affords important advantages such as a more stable bubble pattern which can be switched at higher rates and which is less susceptible to ambient temperature variation and which can be detected by a sensing means not heretofore available.

What is claimed is:

1. In a digital signal translating device of the type having at least one uniaxially anisotropic ferromagnetic crystal platelet having its major plane surface cut perpendicularly to the easy axis of magnetization of said crystal and being capable in the presence of an externally applied magnetic biasing field of sustaining movable cylindrical magnetic domains having their cylindrical axes lying along said easy axis of magnetization, means to apply said magnetic biasing field to said crystal, and conductor access array means to control the positions of said movable domains in said platelet comprising magnetic field generating conductor means to define an array of cylindrical domain retaining positions in said crystal, the improvement comprising:

a two-dimensional lattice array of dots of magnetically susceptible material in intimate physical contact with said major plane surface of said crystal platelet, said material of said dots having a higher permeability than that of said crystal platelet and said array extending over a predetermined area comprising the entire portion of the plane of said major plane surface of said crystal platelet which is to be positioned adjacent said access conductor array means:

each of said dots having a maximum dimension in said plane which is no greater than one-fifth of the minimum diameter of the cylindrical domains which can be sustained in said platelet and each of said dots having a center-to-center spacing from the nearest other dot in said array which is less than one-half said minimum diameter, said center-to-center spacing being uniform between all dots lying on a straight line drawn through any two dots to form a symmetrical array having no predetermined alignment relationship with any individual conductor of said conductor access array but extending uniformly and symmetrically over said entire predetermined area adjacent said conductor access array;

said dots forming in said predetermined area an orderly array positioned to provide a predetermined localized coercivity in said predetermined area of said crystal platelet; and means to detect the motion of said cylindrical magnetic domains in said crystal, said means comprising means inductively coupled to said platelet to detect the motion of field of at least one of said magnetic domains, said inductively coupled means being tuned to resonance at a frequency equal to the frequency at which said magnetic domain is expanded and contracted by said array of dots when said cylindrical domain is moved by a predetermined drive field resulting from a current applied to said conductor access means.

2. A device as in claim 1 wherein said crystal platelet is an orthoferrite and each of said dots is formed of "Permalloy" material.

3. A device as in claim 1 wherein said array of dots is usable, orthogonal array of uniformly shaped and uniformly dimensioned dots.

4. A device as in claim 1 wherein said array of dots is a uniformly shaped and uniformly dimensioned orthogonal array of dots equally spaced along both orthogonal axes.

5. A device as in claim 1 wherein said array of dots has differential spacing in different directions of said array to provide a direction of maximum mobility.

6. A device as in claim 1 wherein said inductively coupled means is a conductor loop surrounding said entire platelet.

7. A device as in claim 1 wherein said inductively coupled means is a plurality of conductor loops, each of which surrounds one of said domain retaining positions in said crystal.

8. In combination:

a. a detection signal generating symmetrical pattern of dots of magnetically susceptible material deposited on a major plane surface of a uniaxially ferromagnetic crystal platelet capable of sustaining movable cylindrical magnetic domains therein; and b. detector means inductively coupled to said platelet to detect the motion of the field of at least one of said magnetic domains when said domain moves past said detector means, said means being tuned to resonance at a frequency equal to the frequency at which said magnetic domain is expanded and contracted by the latching and unlatching of said one moving domain by said signal generating pattern of dots when said domain is moved past said detector at a predetermined velocity.

* * * * *